United States Patent

Huang et al.

[11] Patent Number: 6,032,704
[45] Date of Patent: Mar. 7, 2000

[54] METHOD AND APPARATUS FOR STORING WAFERS WITHOUT MOISTURE ABSORPTION

[75] Inventors: Hsin-Chieh Huang; Yeh-Jye Wann, both of Hsin-Chu; Hsi-Shan Kuo, Taipei, all of Taiwan

[73] Assignee: Taiwan Semiconductor Manufacturing Co., Ltd., Hsin-Chu, Taiwan

[21] Appl. No.: 09/070,395

[22] Filed: Apr. 30, 1998

[51] Int. Cl.⁷ ........................................................ B65B 1/04
[52] U.S. Cl. ................... 141/98; 141/48; 141/63; 141/67; 141/94; 141/95; 141/4; 141/11; 414/935
[58] Field of Search ................... 141/48, 63, 67, 141/70, 94, 95, 98, 4, 11; 414/217, 220, 221, 292, 935, 940; 118/500

[56] References Cited

U.S. PATENT DOCUMENTS

| | | | |
|---|---|---|---|
| 5,378,283 | 1/1995 | Ushikawa | 118/719 |
| 5,806,574 | 9/1998 | Yamashita et al. | 141/63 |
| 5,846,338 | 12/1998 | Bonora et al. | 734/11 |
| 5,879,458 | 3/1999 | Roberson, Jr. et al. | 118/715 |

*Primary Examiner*—Henry J. Recla
*Assistant Examiner*—Timothy L. Maust
*Attorney, Agent, or Firm*—Tung & Associates

[57] ABSTRACT

A method and apparatus for storing wafers without the moisture absorption problem by providing a wafer storage container that has a cavity therein and an inert gas supply line into the cavity for flowing an inert gas at a substantially constant flow rate into the cavity while allowing a portion of the inert gas to escape into surrounding environment outside the cavity such that there is always a positive pressure differential maintained between the cavity and the outside environment to keep out moisture.

17 Claims, 2 Drawing Sheets

METHOD AND APPARATUS FOR STORING WAFERS WITHOUT MOISTURE ABSORPTION

FIELD OF THE INVENTION

The present invention generally relates to a method and apparatus for storing wafers in a semiconductor fabrication facility and more particularly, relates to a method and apparatus for storing wafers in a wafer storage container without the moisture absorption problem by maintaining a positive pressure of an inert gas inside the container higher than the surrounding environment outside the container.

BACKGROUND OF THE INVENTION

In the recent development of semiconductor fabrication technology, the continuous miniaturization in device fabricated demands more stringent requirements in the fabrication environment and contamination control. When the feature size was in the 2 $\mu$m range, a cleanliness class of 100~1000 (which means the number of particles at sizes larger than 0.5 $\mu$m per cubic foot) was sufficient. However, when the feature size is reduced to 0.25 $\mu$m, a cleanliness class of 0.1 is required. It has been recognized that an inert minienvironment may be the only solution to future fabrication technologies when the device size is reduced further. In order to eliminate micro-contamination and to reduce native oxide growth on silicon surfaces, the wafer processing and the loading/unloading procedures of a process tool must be enclosed in an extremely high cleanliness minienvironment that is constantly flushed with ultrapure nitrogen that contains no oxygen and moisture.

Different approaches in modern clean room design have been pursued in recent years with the advent in the ULSI technology. One is the utilization of a tunnel concept in which a corridor separates the process area from the service area in order to achieve a higher level of air cleanliness. Under the concept, the majority of equipment maintenance functions are conducted in low-classified service areas, while the wafers are handled and processed in more costly high-classified process tunnels. For instance, in a process for 16 M and 64 M DRAM products, the requirement of contamination control in a process environment is so stringent that the control of the enclosure of the process environment for each process tool must be considered. This stringent requirement creates a new minienvironment concept which is shown in FIG. 1. Within the enclosure of the minienvironment of a process tool 10, an extremely high cleanliness class of 0.1 (which means the number of particles at sizes larger than 0.1 $\mu$m per cubic foot) is maintained, in contrast to a cleanliness class of 1000 for the overall production clean room area 12. In order to maintain the high cleanliness class inside the process tool 10, the loading and unloading sections 14 of the process tool must be handled automatically by an input/output device such as a SMIF (standard mechanical interfaces) apparatus. A cassette of wafers can be transported into the process tool 10 by a SMIF pod 18 situated on top of the SMIF apparatus 20.

In a conventional SMIF apparatus 20 such as that shown in FIG. 1, the apparatus 20 consists of a robotic transfer system (not shown) or a robotic arm which is normally configured for gripping the top of a cassette 30 from a platform on which the cassette 30 placed (inside a pod). The robotic arm, sometimes replaced by a gripper assembly, is capable of transporting the cassette 30 into the process tool and place it onto a platform 16 vertically such that the cassette 30 is oriented horizontally. At the beginning of the process, an operator positions a SMIF pod 18 on top of a platform/elevator 22 which contains a cassette 30 holding, for instance, 24 wafers in an upright position. The elevator then descends into the SMIF apparatus 20 for the robotic arm to transport the cassette 30 into the process tool. The SMIF system 20 is therefore capable of automatically utilizing clean isolation technology to maintain a high class clean room effectiveness near wafers and processing equipment. The operation of the robotic arm or the gripper is controlled by an ancillary computer (not shown) or by the process tool 10. The cassette 30 carries wafers or other substrates that are being processed.

The SMIF apparatus 20 has a port (or opening) 24 which is intimately mated with an opening 26 in the sidewall 28 of the process tool 10. The SMIF pod 18 is a sealed container with an opening at the bottom and therefore is capable of preventing contamination to the cassette held therein. The pod may also be equipped by a tagging system for the automated identification and recognition of the parts contained in the pod to prevent mis-processing of the wafers and to track through the host computer of the product-lot serial numbers. The tagging system is mounted on the pod with a probe assembly mounted on the port of the SMIF apparatus 20. The SMIF apparatus 20 is therefore an effective interface between an operator and the process tool 10 in that the transporting of cassette can be conducted in a completely automated fashion to avoid human contact by the operator. This insures that the cassette 30 is transported through a highly clean environment into the process tool 10.

A cross-sectional view of the SMIF pod 18 is shown in FIG. 2. It is seen that the wafer cassette 30 is contained in the pod 18 by inserting the cassette 30 through an open bottom 32 of the pod 18. The cassette 30 is used to store a plurality of wafers 34 inside the wafer cassette 30, a plurality of dividers (not shown) are provided on the two interior sidewalls (not shown) of the cassette body 36 such that wafer receptacles are formed between the dividers. A bottom wall 38 of the wafer cassette 30 also performs the functions as a seal for the bottom opening 32 of the SMIF pod 18.

In the manufacturing process for semiconductor devices, wafers that are contained in a wafer cassette are frequently transported in a SMIF pod 18. The SMIF pod is broadly used not only in transporting wafer cassettes between various processing stations, but also in storing wafers in cassettes for those wafers waiting to be processed in a process machine. During such storage, the content of the atmosphere inside the SMIF pod 18 is the same as the clean room atmosphere. The clean room atmosphere contains a regulated amount of moisture, i.e., between about 30% and about 50% relative humidity to avoid excessive static charge build-up and to afford personnel comfort. The same moisture content exists inside the SMIF pod 18 since the pod is positioned in such atmosphere. The moisture content has adverse effect on the wafers stored in the wafer cassette placed in the SMIF pod. The effect is especially severe when the wafers have been deposited, or otherwise formed, with an oxide layer on top of the wafer surface. The moisture readily reacts with the oxide film and causes film stress variations and even corrosion underlayer of metal film. The film stress variations on the surface of a wafer induce other problems in the subsequent deposition or forming processes for IC devices.

The moisture absorption problem incurred in the conventional SMIF pod has lead IC process engineers to come up with various solutions. For instance, in some processes the queue time is set as short as possible such that the exposure of wafer to moisture is minimized. However, depending on the process sequence, a preset short queue time between processes is not always possible. Another solution to the moisture absorption problem incurred in the SMIF pod was proposed in which the SMIF pod is placed in a nitrogen box such that the pod is isolated from the clean room air. Even though this may be an effective process, the preparation and positioning of a large number of nitrogen boxes which are connected to a nitrogen gas supply is extremely difficult and cumbersome to carry out in an IC device fabrication facility.

It is therefore an object of the present invention to provide a method and apparatus for storing wafers that do not have the drawbacks and shortcomings of the conventional wafer storage method and apparatus.

It is another object of the present invention to provide a method for storing wafers without the moisture absorption problem by utilizing a SMIF pod and a wafer cassette therein for holding a plurality of wafers and an inert gas therein.

It is a further object of the present invention to provide a method for storing wafers without the moisture absorption problem which does not require a preset short queue time.

It is another further object of the present invention to provide a method for storing wafers without the moisture absorption problem that does not require the use of a nitrogen box for placing a SMIF pod therein.

It is still another object of the present invention to provide a method for storing wafers without the moisture absorption problem by modifying a SMIF pod such that a continuous flow of nitrogen is fed into the pod.

It is yet another object of the present invention to provide a method for storing wafers without the moisture absorption problem by feeding a continuous flow of nitrogen into a hollow handle of a SMIF pod.

It is still another further object of the present invention to provide a method for storing wafers without the moisture absorption problem by flowing a continuous flow of nitrogen into a SMIF pod such that a positive pressure exists between the pod interior and the surrounding environment.

It is yet another further object of the present invention to provide an apparatus for storing wafers without the moisture absorption problem by supplying a container that is equipped with a gas supply means in fluid communication with a cavity of the container such that a constant flow of an inert gas can be fed into the cavity,

SUMMARY OF THE INVENTION

In accordance with the present invention, a method and apparatus for storing wafers without the moisture absorption problem by maintaining a positive pressure in the apparatus when compared to the surrounding atmosphere are provided.

In a preferred embodiment, a method for preventing moisture from entering a wafer storage container can be carried out by the operating steps of first providing a wafer storage container that has a cavity therein, and flowing an inert gas flow at a substantially constant flow rate into the cavity. The container can be a standard mechanical interface (SMIF) pod for holding wafers. The container is normally adapted for holding a wafer cassette therein. The inert gas flown into the cavity can be selected from the group consisting of nitrogen, argon and helium. The inert gas is flown into the cavity and a pressure is maintained therein at not less than the pressure of the surrounding environment outside the container. The cavity in the storage container is substantially sealed from the surrounding environment outside the container. The method may further include the step of flowing an inert gas flow at a substantially constant flow rate into the cavity and allowing a portion of the inert gas flow to escape into a surrounding environment. The method may also include the step of flowing an inert gas into the cavity and maintaining a pressure of at least 1 psi higher than the pressure of the surrounding environment outside the container. The method may also include the steps of mounting a gas supply pipe equipped with a one-way valve in the container, reading a gas pressure in the gas supply pipe, and adjusting the gas flow rate by a flow controller.

The present invention is further directed to a wafer storage container consisting of a container body constructed of a front wall, a back wall, a left-side wall, a right-side wall and a top wall defining a cavity adapted for receiving a wafer cassette therein, the cavity is further defined by a bottom wall of a wafer cassette when the cassette is installed into the container, and a gas supply means in fluid communication with the cavity of the container for supplying a flow of inert gas into the cavity such that a pressure in the cavity is larger than a pressure in a surrounding environment. The container may be advantageously a SMIF apparatus that has a handle with a hollow interior in fluid communication with the cavity of the container. The gas supply means is in fluid communication with the hollow interior of the handle for supplying a gas to the cavity of the container. The gas supply means may further include a gas supply pipe in fluid communication with the hollow interior of the handle at one end and with a gas supply source at the other end, a one-way gas flow valve at one end of the gas supply pipe in the handle, a gas pressure meter in the gas supply pipe, and a flow controller for adjusting a gas flow rate through the one-way gas flow valve. The gas supply source is selected from the group consisting of a nitrogen source, a helium source and an argon source.

In another preferred embodiment, the present invention provides a method for preventing moisture from entering into a wafer storage container by the operating steps of first providing a wafer storage container that has a cavity therein, the cavity is substantially sealed from a surrounding environment outside the wafer storage container, and then flowing an inert gas at a substantially constant flow rate into the cavity while allowing a portion of the inert gas flow to escape into the surrounding environment. The wafer storage container is adapted for receiving a wafer cassette therein. The method may further include the steps of providing a handle to a top surface of the container, the handle has a hollow interior in fluid communication with the cavity in the container, mounting a gas supply pipe into the hollow interior of the handle, reading a gas pressure in the gas supply pipe, and adjusting the gas flow rate by a flow controller. The method may also include the step of maintaining a pressure in the cavity that is at least one psi higher than the pressure in the surrounding environment.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
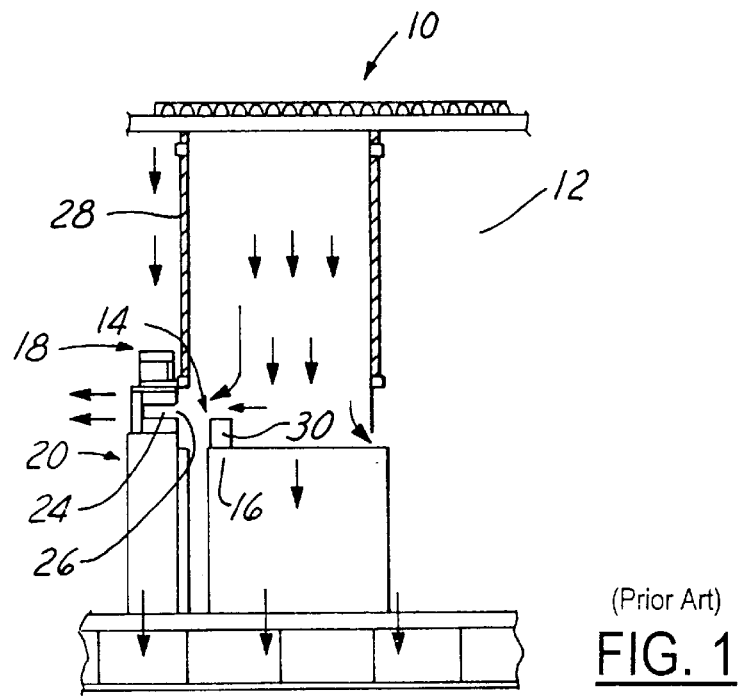
FIG. 1 is an illustration of a cross-section of a conventional semiconductor process tool that has a wafer loading device attached thereto.
Figure 2:
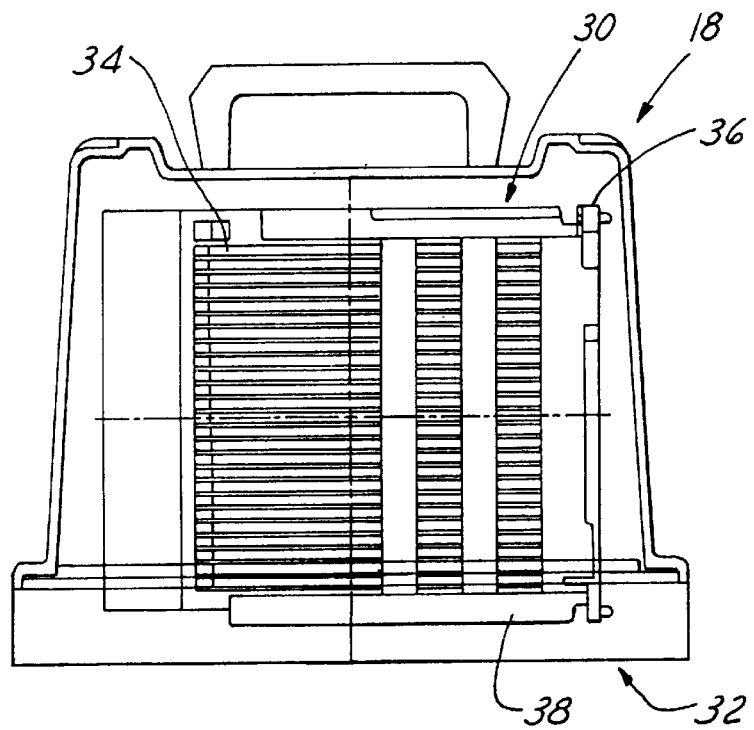
FIG. 2 is an illustration of a cross-sectional view of a SMIF pod holding a wafer cassette therein.

The present invention discloses a method and apparatus for storing wafers without the moisture absorption problem in which a storage container is constantly purged with an inert gas such that a positive pressure differential always exists between the interior cavity of the container and the exterior surrounding environment. The inert purge gas used can be any suitable inert gas, such as nitrogen, helium or argon. Nitrogen is most likely used due to its low cost. The present invention novel method can be utilized on any suitable wafer storage containers, but is most suitably used on a SMIF pod type of wafer container wherein a wafer cassette holding a plurality of wafers is installed. The pressure exerted by the inert gas inside a cavity of the storage container should be higher than the outside surrounding environment such that no moisture may enter into the container. When utilized in a clean room environment, the present invention apparatus effectively prevents the moisture contained in a clean room air from entering into a SMIF pod.

The SMIF pod, with a wafer cassette installed therein is substantially sealed from its outside environment, but is not hermetically sealed. A small portion of the inert gas flow escapes to the surrounding environment while a large portion of the inert gas flow stays inside the cavity such that the cavity always has a gas pressure higher than its surrounding environment. The entering of moisture into the SMIF pod can therefore be prevented. The pressure difference between the cavity and the exterior environment can be any pressure difference, as long as a positive pressure differential exists between the interior and the exterior. For instance, a pressure differential of 1 psi may be adequate for preventing moisture from entering into the cavity of the container. A pressure differential of 2 or 3 psi may be more suitable for preventing the entering of the moisture into the container.

The present invention novel method is more effective and advantageous in preventing moisture absorption onto wafers stored in a SMIF pod than the conventional methods. The conventional method of presetting a queue time that is as short as possible between the various processes is not always possible since some processes take more time than others. The conventional method of placing a SMIF pod into a nitrogen box is awkward and inconvenient due to the fact that an unrealistic number of nitrogen boxes must be available in the fabrication facility for storing the SMIF pods.

The present invention novel apparatus can be easily constructed by providing a gas supply system into a hollow handle of the SMIF pod. The gas supply pipe is further equipped with a one-way flow valve at an opening such that an inert gas can only flow out of the pipe and not being syphoned back into the gas supply system. The gas supply pipe can also be equipped with a flow meter which is mounted on the outside of the handle such that the gas flow rate through the supply pipe can be easily identified during the process. A flow control valve is further supplied to the gas supply pipe with an adjusting means outside the handle for easy control of the inert gas flow into the cavity of the pod.

Figure 3:
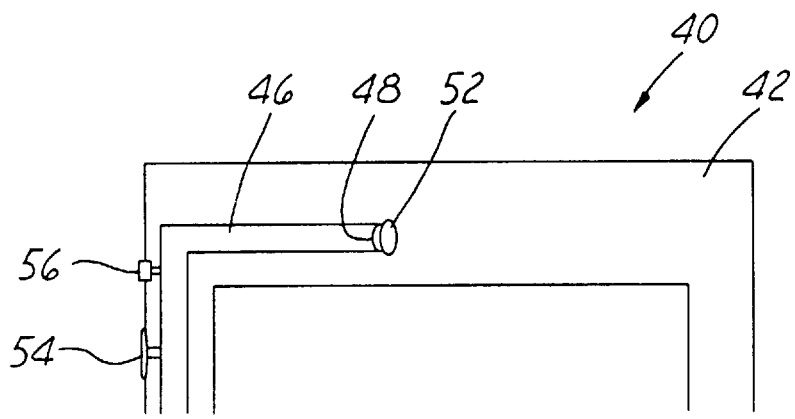
FIG. 3 is a cross-sectional view of a hollow handle for the SMIF apparatus for accommodating a gas supply type, a flow meter and a flow control valve.

The present invention novel apparatus is shown in a simplified manner in FIG. 3. Handle 40 is provided which has a hollow cavity 42 therein. A gas supply pipe 46 is installed into the cavity 42 which has an opening 48 that is fitted with a one-way valve 52. The gas supply pipe 46 is further equipped with a flow meter 54 and a flow control valve 56. As shown in FIG. 3, an inert gas flow exits the one-way valve 52 into the cavity 42 of the handle and then flows into the SMIF pod cavity (not shown). An added benefit for mounting the gas supply pipe 46 in the handle 40 is that the inert gas can be easily injected into the pod cavity while not interfering with wafers or the wafer cassette installed in the pod cavity. It should be noted that the present invention novel method can be practiced by other suitable means such as mounting the gas supply pipe at any other suitable locations of the SMIF pod as long as it does not interfere with the loading and unloading of the wafer cassette.

Figure 4:
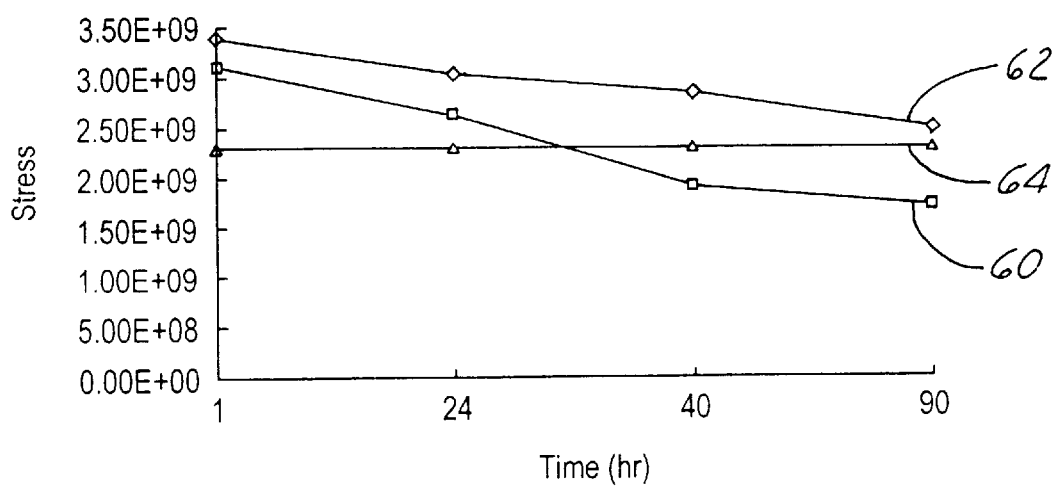
FIG. 4 is an illustration showing the film stress dependence on storage time in a SMIF pod for various samples in air or in nitrogen.

The effectiveness of the present invention novel method and apparatus is shown in FIG. 4. FIG. 4 illustrates the dependence of film stress on the storage time of the wafer in a SMIF pod. Curve 60 indicates data obtained on wafer samples that were stored in a SMIF pod filled with clean room air. The wafers were first coated with a silicon oxide film layer. Since silicon oxide films are sensitive to moisture absorption, they are ideal samples to study the effect of the present invention method. It is seen from curve 60 that there is a large variation in film stresses when wafers are stored in the pod for different lengths of time. The film stress decreases significantly in wafer samples which were stored in air for a time period as long as 90 hours. FIG. 4 also shows curve 62 which is obtained on wafer samples stored in a SMIF pod which was initially filled with an inert gas such as nitrogen. In this test, the SMIF pod is initially filled with nitrogen gas and then the gas is allowed to leak out after a prolonged period of time. No new inert gas was refilled into the pod cavity, i.e., no continuous flow of inert gas was used. It is seen from curve 62 that while the film stress variations were reduced when compared to the samples left in air, i.e., curve 60, there is still a significant variations in film stresses when wafers are stored in the pod cavity for different lengths of time.

Curve 64 indicates data points obtained on both nitrogen treated wafers and on wafers stored in a present invention apparatus. The nitrogen treated wafers are wafers coated with a SACVD (sub-atmospheric chemical vapor deposition) oxide film that are treated with nitrogen gas plasma in a CVD chamber. The treated wafer surface becomes non-moisture sensitive due to the formation of a top surface layer of nitride. The data obtained on wafers stored in a present invention apparatus is also shown by curve 64. The effectiveness of the present invention novel method is amply demonstrated by the flatness of curve 64 in that the film stresses are completely independent on the number of hours stored in the SMIF pod.

The present invention novel method and apparatus have therefore been amply demonstrated in the above descriptions and in the appended drawings of FIGS. 3 and 4. It should be noted that while, in the preferred embodiment, the inert gas was fed into the SMIF pod cavity through a hollow handle on the pod, the present invention novel method is in no way limited to such arrangement. The inert gas can be fed into the cavity of a SMIF pod through any convenient locations as long as it does not interfere with the wafer cassette or the wafers stored therein.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A wafer storage container comprising:
   a container body consisting of a front wall, a back wall, a left-side wall, a right-side wall and a top wall defining a cavity adapted for receiving a wafer cassette therein,
   said cavity being further defined by a bottom wall of a wafer cassette when said cassette is installed in aid container, and
   a gas supply means in fluid communication with the cavity of said container for supplying a flow of inert gas into said cavity such that a pressure in said cavity being higher than a pressure in a surrounding environment, said gas supply means further comprising a gas supply pipe in fluid communication with the hollow interior of a handle at one end and with a gas supply source at the other end,
   a one-way gas flow valve at one end of said gas supply pipe in said handle,
   a gas flow meter in said gas supply pipe, and
   a flow controller for adjusting a gas flow rate through said one-way gas flow valve.

2. A wafer storage container according to claim 1, wherein said container is a SMIF (standard mechanical interface) apparatus.

3. A wafer storage container according to claim 1, wherein said container body further comprising a handle having a hollow interior in fluid communication with said cavity of the container.

4. A wafer storage container according to claim 1, wherein sad gas supply means being in fluid communication with hollow interior in a handle for supplying a gas to said cavity of the container.

5. A wafer storage container according to claim 1, wherein said gas supply source is selected from the group consisting of a nitrogen source, a helium source and an argon source.

6. A method for preventing moisture from entering a wafer storage container comprising the steps of:
   providing a wafer storage container having a cavity therein,
   mounting a gas supply line equipped with a one-way value to a hollow handle on a top surface of said container,
   flowing an inert gas flow at a substantially constant flow rate into said cavity,
   reading a gas pressure in said gas supply pipe, and
   adjusting said gas flow rate by a flow controller.

7. A method for preventing moisture from entering a wafer storage container according to claim 6, wherein said container is a SMIF (standard mechanical interface) pod for holding wafers.

8. A method for preventing moisture from entering a wafer storage container according to claim 6, wherein said container is adapted for holding a wafer cassette therein.

9. A method for preventing moisture from entering a wafer storage container according to claim 6, wherein said inert gas is selected from the group consisting of nitrogen, argon and helium.

10. A method for preventing moisture from entering a wafer storage container according to claim 6, wherein said inert gas flowing into said cavity and maintaining a pressure not less than the pressure of a surrounding environment outside of the container.

11. A method for preventing moisture from entering a wafer storage container according to claim 6, wherein said cavity in said wafer storage container is substantially sealed from the surrounding environment outside the wafer storage container.

12. A method for preventing moisture from entering a wafer storage container according to claim 6 further comprising the step of flowing an inert gas flow at a substantially constant flow rate into said cavity and allowing a portion of said inert gas flow to escape into a surrounding environment.

13. A method for preventing moisture from entering a wafer storage container according to claim 6 further comprising the step of flowing said inert gas flow into said cavity and maintaining a pressure of at least 1 psi higher than the pressure of the surrounding environment outside of the container.

14. A method for preventing moisture from entering a wafer storage container according to claim 6, wherein said inert gas flowing into said container is nitrogen for maintaining a pressure of at least 1 psi higher than the pressure of the surrounding environment outside of the container.

15. A method for preventing moisture from entering into a wafer storage container comprising the steps of:
   providing a wafer storage container having a cavity therein, said cavity being substantially sealed from a surrounding environment outside the wafer storage container,
   providing a handle to a top surface of said container, said handle having a hollow interior in fluid communication with said cavity in said container,
   mounting a gas supply pipe into the hollow interior of said handle,
   flowing an inert gas flow at a substantially constant flow rate into said cavity while allowing a portion of said inert gas flow to escape into said surrounding environment,
   reading a gas pressure in said gas supply pipe, and
   adjusting said gas flow rate by a flow controller.

16. A method for preventing moisture from entering into a wafer storage container according to claim 15, wherein said container is adapted for receiving a wafer cassette therein.

17. A method for preventing moisture from entering into a wafer storage container according to claim 15 further comprising the step of maintaining a pressure in said cavity that is at least 1 psi higher than the pressure in said surrounding environment.

* * * * *